(12) United States Patent
Sakamoto et al.

(10) Patent No.: US 6,501,162 B2
(45) Date of Patent: Dec. 31, 2002

(54) SEMICONDUCTOR DEVICE, SEMICONDUCTOR MODULE AND HARD DISK

(75) Inventors: Noriaki Sakamoto; Yoshiyuki Kobayashi; Junji Sakamoto; Yukio Okada; Yusuke Igarashi; Eiju Maehara; Kouji Takahashi, all of Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/809,918

(22) Filed: Mar. 16, 2001

(65) Prior Publication Data

US 2002/0041012 A1 Apr. 11, 2002

(30) Foreign Application Priority Data

Oct. 5, 2000 (JP) ........................................ 2000-306667

(51) Int. Cl.⁷ .............................................. H01L 23/02
(52) U.S. Cl. ...................... 257/678; 257/503; 257/668; 257/673; 257/737; 257/780
(58) Field of Search ............................... 257/503, 668, 257/673, 737, 780; 438/123

(56) References Cited

U.S. PATENT DOCUMENTS 5,886,399 A * 3/1999 Ohsawa et al. .............. 257/668
6,001,671 A   12/1999 Fjelstad
6,074,898 A * 6/2000 Ohsawa et al. .............. 438/123

OTHER PUBLICATIONS

Nikkei Electronics, No. 691, Jun. 16, 1997, pp. 92–120.

* cited by examiner

*Primary Examiner*—David Nelms
*Assistant Examiner*—Mai-Huong Tran
(74) *Attorney, Agent, or Firm*—Fish & Richardson P.C.

(57) ABSTRACT

A heat radiation electrode (15) is exposed from the back surface of an insulating resin (13), and a metal plate (23) is affixed to the heat radiation electrode (15). The back surface of this metal plate (23) and the back surface of a first supporting member (11) are substantially within a same plane, so that it is readily affixed to a second supporting member (24). Accordingly, the heat generated by the semiconductor chip can be efficiently dissipated via the heat radiation electrode (15), the metal plate (23) and the second supporting member (24).

36 Claims, 11 Drawing Sheets

SEMICONDUCTOR DEVICE, SEMICONDUCTOR MODULE AND HARD DISK

BACKGROUND OF THE INVENTION

The present invention relates to a semiconductor device, a semiconductor module and a hard disk, and especially to a structure capable of efficiently dissipating heat from a semiconductor chip.

Due to the recent growth of the use of semiconductor devices in portable devices and small/densely-mounted devices, the reduction in size and weight and the improvement in heat dissipation properties are demanded at the same time. In addition, semiconductor devices are mounted on various types of substrates, which, in turn, are mounted in various many systems as semiconductor modules. As for such a substrate, the use of a ceramic substrate, a printed board, a flexible sheet, a metal substrate or a glass substrate etc. may be contemplated, and the following description gives one example thereof. Here, the semiconductor module is explained as being mounted on a flexible sheet.

FIG. 14 shows an example in which a semiconductor module using a flexible sheet is mounted in a hard disk 100. This hard disk 100 may be, for example, the one described in detail in an article of Nikkei Electronics (No. 691, Jun. 16, 1997, p.92-).

This hard disk 100 is accommodated within a casing 101 made of a metal, and comprises a plurality of recording disks 102 that are integrally attached to a spindle motor 103. Over the surfaces of individual recording disks 102, magnetic heads 104 are respectively disposed each with a very small clearance. These magnetic heads 104 are attached at the tips of suspensions 106 which are affixed to the ends of respective arms 105. A magnetic head 104, a suspension 106 and an arm 105 together form one integral body and this integral body is attached to an actuator 107.

The magnetic heads 104 must be electrically connected with a read/write amplifying IC 108 in order to perform read and write operations. Accordingly, a semiconductor module comprising this read/write amplifying IC 108 mounted on a flexible sheet 109 is used, and the wirings provided on this flexible sheet 109 are electrically connected, ultimately, to the magnetic heads 104. This semiconductor module 110 is called "flexible circuit assembly", typically abbreviated as "FCA".

From the back surface of the casing 101, connectors 111 provided on the semiconductor module 110 are exposed, and these connector (male or female) 111 and connectors (female or male) attached on a main board 112 are engaged. On this main board 112, wirings are provided, and driving ICs for the spindle motor 103, a buffer memory and other ICs for a drive, such as ASIC, are mounted.

The recording disk 102 spins at, for example, 4500 rpm via the spindle motor 103, and the actuator 107 detects the position of the magnetic head 104. Since this spinning mechanism is enclosed by a cover provided over the casing 101, there is no way to completely prevent the accumulation of heat, resulting in the temperature rise in the read/write amplifying IC 108. Therefore, the read/write amplifying IC 108 is attached to the actuator 107 or the casing 101 etc. at a location having a better heat dissipation property than elsewhere. Further, since revolutions of the spindle motor 103 tend to high speed such as 5400, 7200 and 10000 rpm, this heat dissipation has more importance.

In order to provide further detail of the FCA explained above, the structure thereof is shown in FIG. 15. FIG. 15A is the plan view, and FIG. 15B is a cross-sectional view taken along the line A—A which cuts across the read/write amplifying IC 108 provided on one end of the module. This FCA 110 is attached to an internal portion of the casing 101 in a folded-state, so that it employs a first flexible sheet 109 have a two-dimensional shape that can easily be folded.

On the left end of this FCA 110, the connectors 111 are attached, forming a first connection section 120. First wirings 121 electrically connected to these connectors 111 are adhered on the first flexible sheet 109, and they extend all the way to the right end. The first wirings 121 are then electrically connected to the read/write amplifying IC 108. Leads 122 of the read/write amplifying IC 108 to be connected to the magnetic heads 104 are connected with second wirings 123 which, in turn, are electrically connected to third wirings 126 on a second flexible sheet 124 provided over the arm 105 and suspension 106. That is, the right end of the first flexible sheet 109 forms a second connection section 127 at which the first flexible sheet 109 is connected to the second flexible sheet 124. Alternatively, the first flexible sheet 109 and the second flexible sheet 124 may be integrally formed. In this case, the second wirings 123 and the third wirings 126 are provided integrally.

On the back surface of the first flexible sheet 109 on which the read/write amplifying IC 108 is to be provided, a supporting member 128 is disposed. As for this supporting member 128, a ceramic substrate or an Al substrate may be used. The read/write amplifying IC 108 is thermally coupled with a metal that is exposed to inside of the casing 101 through this supporting member 128, so that the heat generated in the read/write amplifying IC 108 can be externally released.

With reference to FIG. 15B, a connecting structure between the read/write amplifying IC 108 and the first flexible sheet 109 will now be explained.

This flexible sheet 109 is constituted by laminating, from the bottom, a first polyimide sheet 130 (first PI sheet), a first adhesion layer 131, a conductive pattern 132, a second adhesion layer 133 and a second polyimide sheet 134 (second PI sheet), so that the conductive pattern 132 is sandwiched between the first and second PI sheets 130 and 134.

In order to connect the read/write amplifying IC 108, a portion of the second PI sheet 134 and the second adhesion layer 133 are eliminated at a desired location to form an opening 135 which exposes the conductive pattern 132. The read/write amplifying IC 108 is electrically connected thereto through leads 122 as shown in the figure.

The semiconductor device packaged by an insulating resin 136 as shown in FIG. 15B has heat dissipating paths indicated by arrows for externally dissipating its heat, but there has been a problem in that, due to the thermal resistance given by the insulating resin 136, the heat generated by the read/write amplifying IC 108 cannot be efficiently dissipated to the outside the device.

Further details will now be explained using this example in hard disk application. As for the read/write transfer rate of a hard disk, a frequency of 500 MHz to 1 GHz, or even a greater frequency, is required, so that the read/write speed of the read/write amplifying IC 108 must be fast. To this end, the paths of the wirings on the flexible sheet that are connected to the read/write amplifying IC 108 has to be reduced, and the temperature rise in the read/write amplifying IC 108 must be suppressed.

Especially, since the recording disks 102 are spinning at a high speed, and the casing 101 and the lid provide a sealed space, the interior temperature would rise up to around 70 to 80° C. On the other hand, a typical allowable temperature for the operation of an IC is approximately 125° C. This means that, from the interior temperature of 80° C., a further temperature rise by approximately 45° C. is permissible for the read/write amplifying IC 108. However, where the thermal resistance of the semiconductor device itself and FCA is large, this allowable operation temperature can easily be exceeded, thereby disabling the device to provide its actual performance level. Accordingly, a semiconductor device and FCA having superior heat dissipating properties are being demanded.

Furthermore, since the operation frequency is expected to further increase in the future, further temperature rise is also expected in the read/write amplifying IC 108 itself due to the heat generated by computing operations. At room temperature, the IC can provide the performance at its intended operation frequency, however, where it is placed inside of a hard disk, its operation frequency has to be reduced in order to restrain the temperature rise.

As described above, further heat dissipating properties of semiconductor device, semiconductor module (FCA) are demanded in connection with the increase of the operation frequency in the future.

On the other hand, the actuator 107, and the arms 105, suspensions 106 and magnetic heads 104 attached thereto has to be designed as light-weighted as possible in order to reduce the moment of inertia. Especially, where the read/write amplifying IC 108 is mounted on the surface of the actuator 107 as shown in FIG. 14, the weight reduction is demanded also for the IC 108 and FCA 110.

SUMMARY OF THE INVENTION

The present invention was invented in consideration with the above problems, and in the first aspect, it provides a semiconductor device comprising a semiconductor chip integrally molded by an insulating resin, the semiconductor device having exposed on the back surface thereof, a pad electrically connected to a bonding electrode of the semiconductor chip and a heat radiation electrode thermally coupled with the back surface of the semiconductor chip, wherein the problem is solved by providing a metal plate on the exposed portion of the heat radiation electrode in a manner so that the metal plate protrudes beyond the back surface of the pad.

Since this protruding metal plate would become flash with the back surface of the flexible sheet which is the first supporting member, the structure allows the metal plate to be adhered or abutted to a heat-dissipating plate which is the second supporting member. Accordingly, the heat from the semiconductor chip can be transmitted to the heat-dissipating plate.

In the second aspect, the problem is solved by disposing the back surface of the pad and the back surface of the heat radiation electrode substantially within a same plane.

In the third aspect, the problem is solved by affixing the semiconductor chip and the heat radiation electrode together using an insulating material or a conductive material.

In the fourth aspect, the problem is solved by affixing the heat radiation electrode and the metal plate together using an insulating material or a conductive material.

In the fifth aspect, the problem is solved by forming the heat radiation electrode and the metal plate integrally from a same material.

In the sixth aspect, the problem is solved by having the back surface of the insulating resin protrude beyond the back surface of the pad.

In the seventh aspect, the problem is solved by having the side surfaces of the pad and the back surface of the insulating resin that extends from the side surfaces of the pad define a same curved surface.

The back surface of the insulating resin traces an etched surface, and makes a protrusive curve. Provided adjacently to this curved portion are spots of a brazing material such as solder, so that this portion can prevent the short-circuiting between these spots of the brazing material.

In the eighth aspect, a semiconductor module is provided, which comprises a first supporting member having a conductive pattern provided thereon, a semiconductor device comprising a semiconductor chip which is electrically connected to the conductive pattern and is integrally molded by an insulating resin, the semiconductor device having exposed on the back surface thereof, a pad electrically connected to a bonding electrode of the semiconductor chip and a heat radiation electrode thermally coupled with the back surface of the semiconductor chip, wherein the problem is solved by electrically connecting the pad to the conductive pattern provided on the first supporting member, and providing an opening to the first supporting member at a location which corresponds to the heat radiation electrode, the opening accommodating a metal plate which is affixed to the heat radiation electrode.

In the ninth aspect, the problem is solved by adhering a second supporting member having the metal plate affixed thereto to the back surface of the first supporting member.

In the tenth aspect, the problem is solved by forming the heat radiation electrode and the metal plate integrally from a same material.

In the eleventh aspect, the problem is solved by providing a fixation plate made of a conductive material over the second supporting member at a location which corresponds to the metal plate, and by thermally coupling the fixation plate and the metal plate.

In the twelfth aspect, the problem is solved by forming, respectively, the metal plate mainly by Cu, the second supporting member mainly by Al, and the fixation plate by a plated film mainly made of Cu formed on the second supporting member.

In the thirteenth aspect, a semiconductor module as claimed in claim 13 is provided, in which the back surface of the insulating resin protrudes beyond the back surface of the pad.

In the fourteenth aspect, the problem is solved by having the side surfaces of the pad and the back surface of the insulating resin which extends from the side surfaces of the pad define a same curved surface.

In the fifteenth aspect, the problem is solved by using the semiconductor chip as a read/write amplifying IC for a hard disk.

In the sixteenth aspect, a semiconductor device is provided, which comprises a semiconductor chip integrally molded by an insulating resin, the semiconductor device having exposed on the back surface thereof, a pad electrically connected to a bonding electrode of the semiconductor chip, an external connection electrode that extends via a wiring integral with the pad, and a heat radiation electrode thermally coupled to the back surface of the semiconductor chip, wherein the problem is solved by disposing a metal plate over the exposed portion of the heat radiation electrode in a manner so as that the metal plate protrudes beyond the back surface of the external connection electrode.

In the seventeenth aspect, the problem is solved by disposing the back surface of the external connection electrode and the back surface of the heat radiation electrode substantially within a same plane.

In the eighteenth aspect, the problem is solved by affixing the semiconductor chip and the heat radiation electrode together with an insulating material or a conductive material.

In the nineteenth aspect, the problem is solved by affixing the heat radiation electrode and the metal plate together with an insulating material or a conductive material.

In the twentieth aspect, the problem is solved by forming the heat radiation electrode and the metal plate integrally from a same material.

In the twenty-first aspect, the problem is solved by having the back surface of the insulating resin protrude beyond the back surface of the external connection electrode.

In the twenty-second aspect, the problem is solved by having the side surfaces of the external connection electrode and the back surface of the insulating material extending from the side surface of the external connection electrode define a same curved surface.

In the twenty-third aspect, a semiconductor module is provided, which comprises a first supporting member having a conductive pattern provided thereon and a semiconductor device comprising a semiconductor chip which is electrically connected to the conductive pattern and is integrally molded by an insulating resin, the semiconductor device having exposed on the back surface thereof, a pad electrically connected to a bonding electrode of the semiconductor chip, an external connection electrode provided via a wiring which is integral with the pad, and a heat radiation electrode thermally coupled to the back surface of the semiconductor chip being exposed from the back surface of the semiconductor device, wherein the problem is solved by electrically connecting the conductive pattern provided on the first supporting member to the external connection electrode, and providing an opening in the first supporting member at a location corresponding to the heat radiation electrode, the opening accommodating a metal plate affixed to the heat radiation electrode.

In the twenty-fourth aspect, the problem is solved by adhering a second supporting member having the metal plate affixed thereto to the back surface of the first supporting member.

In the twenty-fifth aspect, the problem is solved by forming the heat radiation electrode and the metal plate integrally from a same material.

In the twenty-sixth aspect, the problem is solved by providing a fixation plate made of a conductive material to the second supporting member at a location corresponding to the metal plate, and by thermally coupling the fixation plate and the metal plate.

In the twenty-seventh aspect, the problem is solved by forming, respectively, the metal plate mainly by Cu, the second supporting member mainly by Al and the fixation plate by a plated film mainly made of Cu formed on the second supporting member.

In the twenty-eighth aspect, the problem is solved by having the back surface of the insulating adhesive means protrude beyond the back surface of the external connection electrode.

In the twenty-ninth aspect, the problem is solved by having the side surfaces of the external connection electrode and the back surface of the insulating adhesive means adhered to the external connection electrode define a same curved surface.

In the thirtieth aspect, the problem is solved by using the semiconductor chip as a read/write amplifying IC for a hard disk.

DETAILED DESCRIPTION OF THE PREFERRED EMBODIMENTS

The present invention provides a thin and small semiconductor device having a superior heat-dissipating property, and a semiconductor module having this semiconductor device mounted, such as a semiconductor module mounted on a flexible sheet (hereinafter referred to as "FCA"), thereby improving the characteristics of, for example, a hard disk.

Figure 1A:
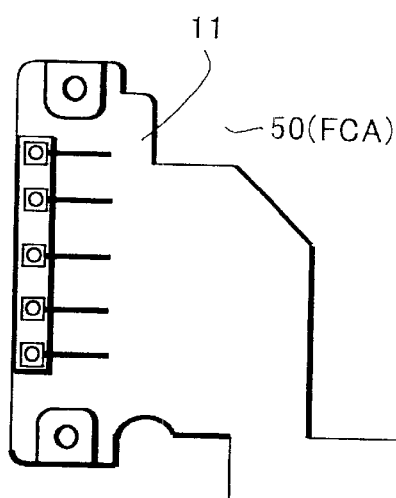
FIGS. 1A and 1B is a diagram illustrating a semiconductor module according to the present invention.
Figure 1C:
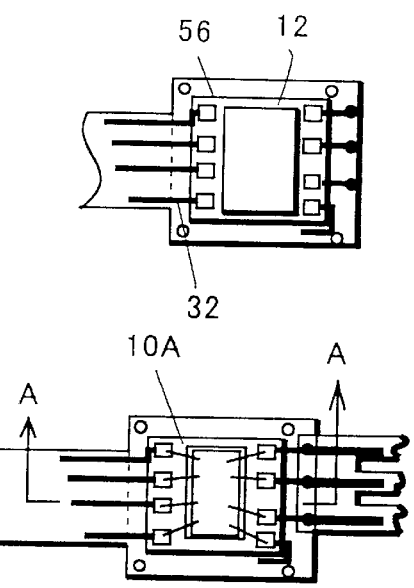
Figure 1B:
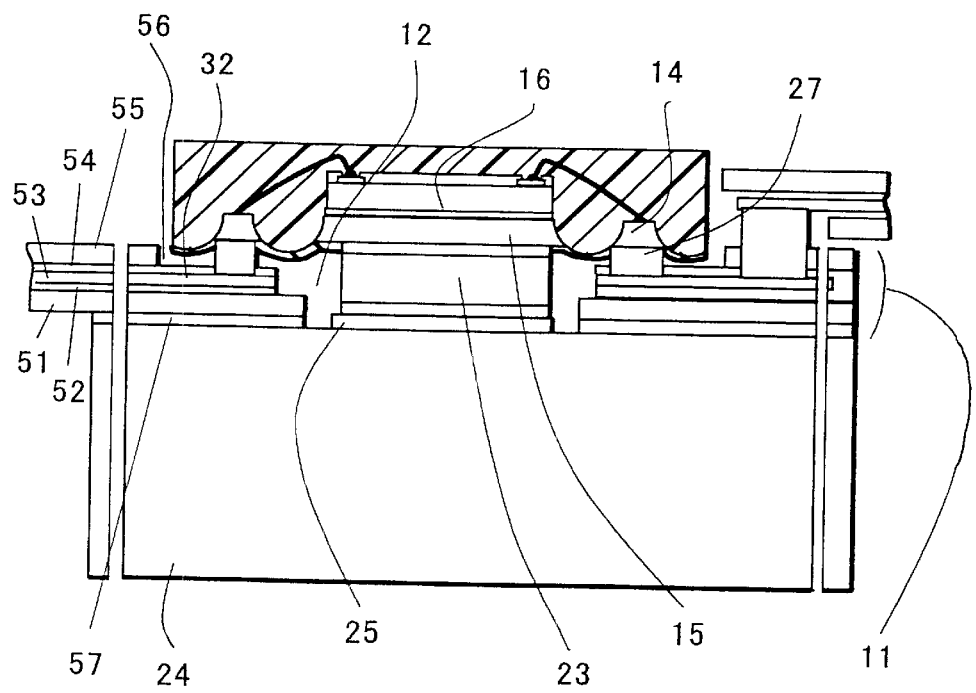
Figure 13A:
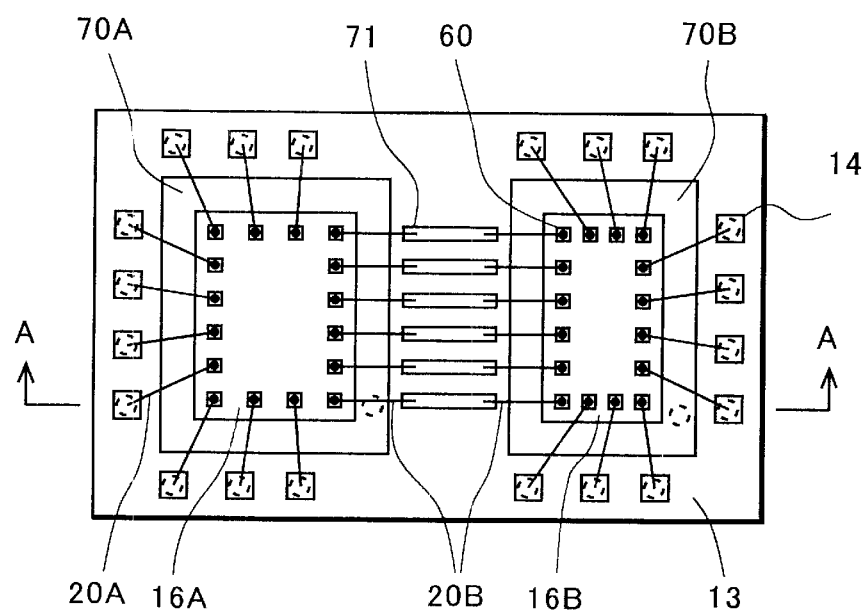
FIGS. 13A and 13B is a diagram illustrating a semiconductor module according to the present invention.
Figure 13B:
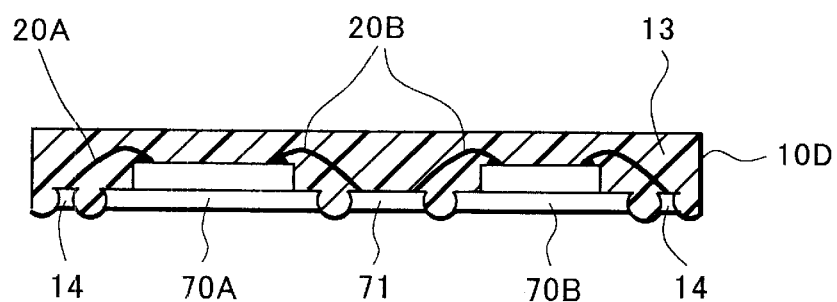
Figure 14:
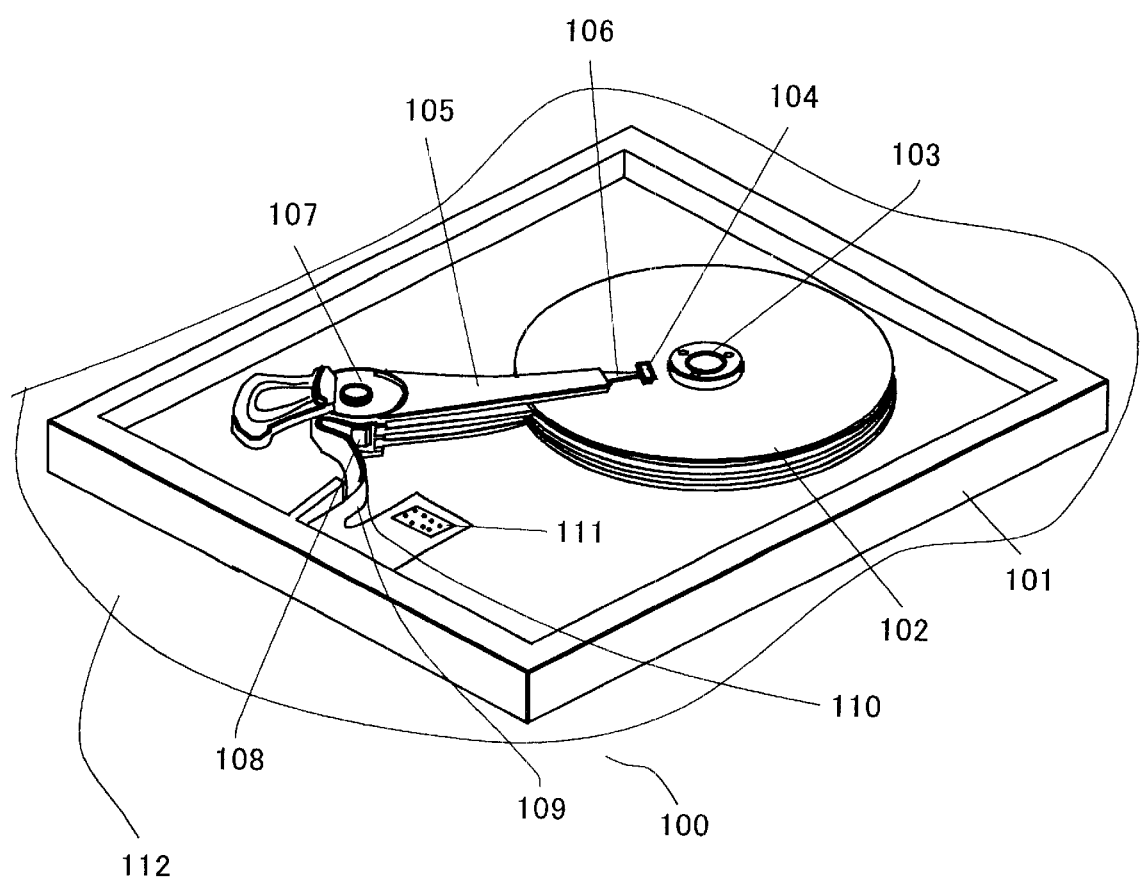
FIG. 14 is a diagram illustrating a hard disk.

First, reference shall be made to FIG. 14 illustrating an exemplary hard disk in which the FCA is implemented, and then to FIG. 1 showing an FCA. A semiconductor device mounted on this FCA and the manufacturing method thereof are shown in FIGS. 2 through 13.

Embodiment 1

First Embodiment is provided to illustrate an apparatus in which the FCA 110 is implemented.

As for this apparatus, the exemplary hard disk 100 that has been used for illustrating the conventional art will again be used.

The hard disk 100 may be mounted on a main board 112 as necessary in order to place it in a computer etc. This main board 112 includes female (or male) connectors. Male (or female) connectors 111 provided on the FCA and exposed from the back surface of the casing 101 are connected with these connectors on the main board 112. Within the casing 101, a plurality of recording disks 102 used as a recording medium are provided in a number corresponding to the storage capacity of the hard disk. Since each of the magnetic heads 104 floats and scans over each of the recording disks 102 at a position approximately 20 nm to 30 nm away from the disk, the interval between the recording disks 102 are designed so as to allow this scanning to be undisturbed. The disks are retained at this interval and attached to a spindle motor 103. This spindle motor 103 is mounted on a mounting board, and a connector arranged on the back surface of this mounting board is exposed from the back surface of the casing 101. This connector is connected to a connector of the main board. Accordingly, mounted on this main board 112 are, an IC for driving the read/write amplifying IC 108 for the magnetic heads 104, an IC for driving the spindle motor 103, an IC for driving an actuator, a buffer memory for temporarily storing data, and other ASICs etc. for implementing the manufacturer's own driving scheme. Of cause, any additional active and passive elements may also be mounted.

The wirings connecting between the magnetic heads 104 and the read/write amplifying IC 108 are designed to be as short as possible, so that the read/write amplifying IC 108 is disposed on the actuator 107. Since the semiconductor device of the present invention is extremely thin, it may instead be mounted over the arm 105. In this case, as shown in FIG. 1, the back surface of the semiconductor device 10 exposes from the opening 12 of the first supporting member 11, and the back surface of the semiconductor device 10 is thermally coupled with the arm 105, so that the heat from the semiconductor device 10 is externally dissipated via the arm 105 and the casing 101. Since in this example, an application to a hard disk is assumed, a flexible sheet has been selected for the use as the first supporting member, however, depending on the types of the apparatus, a printed board or a ceramic substrate etc. may instead be selected as the first supporting member.

Embodiment 2

Second Embodiment is provided to illustrate a semiconductor device.

Figure 2A:
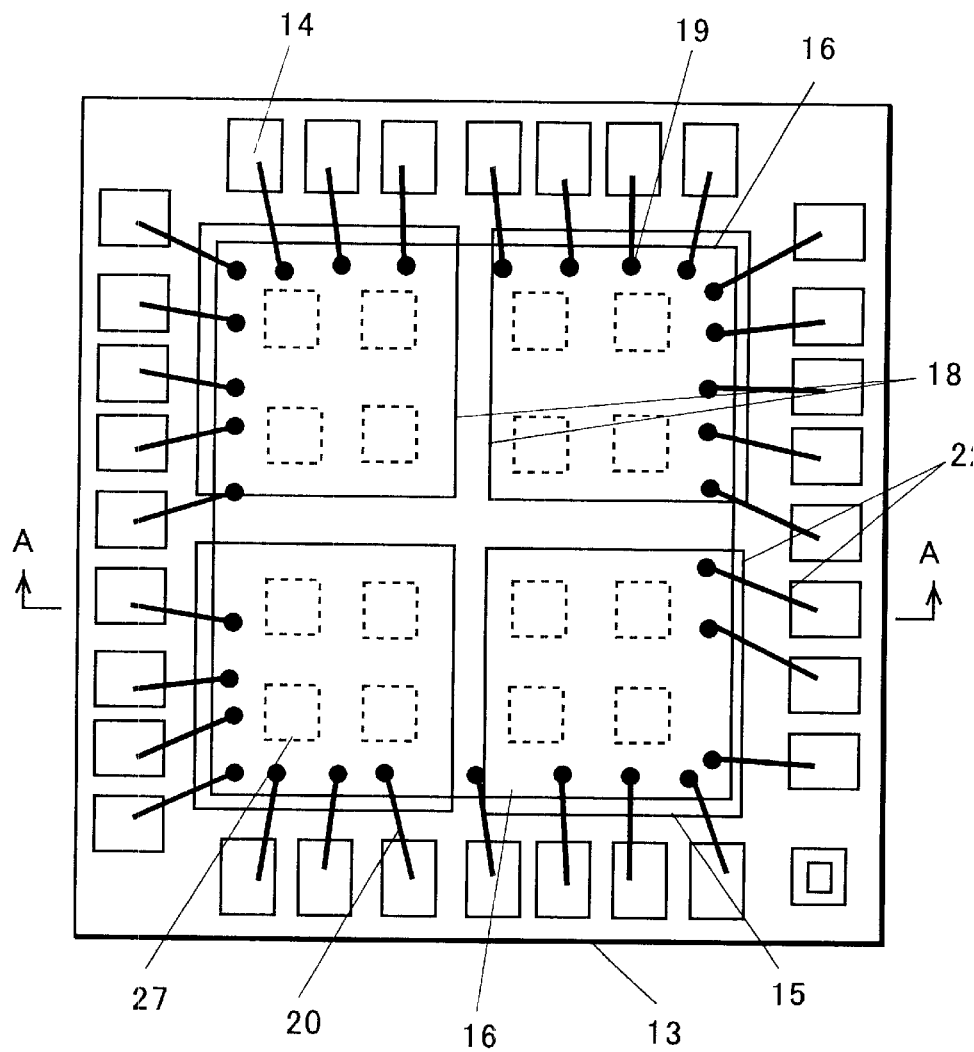
FIGS 2A and 2B is a diagram illustrating a semiconductor module according to the present invention.
Figure 2B:
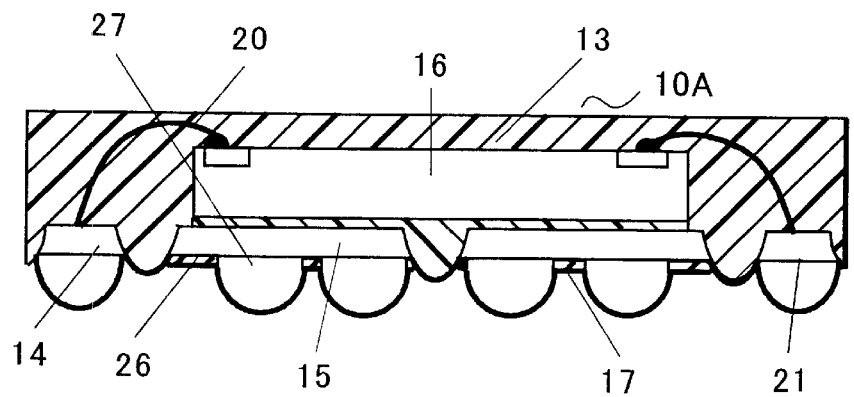

The semiconductor device according to the second embodiment of the present invention will now be explained with reference to FIG. 2. FIG. 2A is a plan view of the semiconductor device, and FIG. 2B is a cross-sectional view taken along the ling A—A.

In FIG. 2, the following elements are shown as embedded within an insulating resin 13; bonding pads 14, a heat radiation electrode 15, and a semiconductor chip 16 disposed over the heat radiation electrode 15. Using an insulating adhesive means 17, the semiconductor chip 16 is affixed to the heat radiation electrode 15, which is divided into four pieces in order to achieve good adhesion. The isolation trenches formed by this division are indicated by the numeral 18.

The bonding electrodes 19 and the bonding pads 14 are electrically connected via thin metal lines 20.

The back surfaces of the bonding pads 14 are exposed from the insulating resin 13, and as they are, form external connection electrodes 21, and the side surfaces of the bonding pads 14 are etched non-anisotropically. These etched portions are formed by a wet etching method, so that they have a curved structure which promotes an anchor effect.

This structure is formed by four elements including the semiconductor chip 16, a plurality of conductive patterns 14 and 15, the insulating adhesion means 17, and the insulating resin 13 within which the former elements are embedded. Within a region for the semiconductor chip 16 is to be disposed, the insulating adhesive means 17 is formed over and between the pieces of the heat radiation electrode 15, especially within the isolation trenches 18 formed by the etching, so that it's back surface is exposed from the back surface of the semiconductor device 10A. All the elements including the above are molded within the insulating resin 13. The bonding pads 14 and semiconductor chip 16 are supported by this insulating resin 13.

As for the insulating adhesive means 17, an adhesive made of an insulating material or an insulating adhesive sheet is preferable. As it will be apparent from the later-described manufacturing method, the material is desirably the one that can be adhered over the entire wafer and patterned through photolithography. In a case where an electrical connection is permissible between the heat radiation electrode 15 and the back surface of the semiconductor chip 16, a brazing material or a conductive paste may be used instead of the insulating adhesive means 17.

As for the insulating resin, a heat-curable resin such as epoxy resin, or a thermoplastic resin such as polyimide resin or polyphenylene sulfide etc. may be used.

Any resin material can be used as the insulating resin as long as it can be cured within a metal mold, or can be applied by dipping or coating. For the conductive pattern 14, a conductive foil mainly made of Cu, a conductive foil mainly made of Al or an Fe—Ni alloy, a laminate of Al—Cu, a laminate of Al—Cu—Al or Cu—Al—Cu, or the like may be used. Of course other conductive material may also be used, and especially desirable are those conductive materials that can be etched, or that can be evaporated by laser. When the half-etching, plating and thermal stress characteristics are concerned, a conductive material mainly made of Cu formed through rolling is suitable.

According to the present invention, the trenches 18 and 22 are also filled with the insulating resin 13 and the insulating adhesive means 17 so that slipping-out of the conductive pattern maybe prevented. Also, by performing non-anisotropic etching through a dry-etch or wet-etch method, the side surfaces of the bonding pads 14 may be processed to have a curved structure thereby promoting the anchor effect, which in turn realizes a structure that would not allow the conductive pattern 14 and heat radiation electrode 15 to slip out from the insulating resin 13.

Moreover, the back surface of the heat radiation electrode 15 is exposed from the back surface of the package. Therefore, the back surface of the heat radiation electrode 15 would form a structure that can be abutted or attached to the later-described metal plate 23, the second supporting member 24 or a fixation plate 25 formed on the second supporting member 24. Accordingly, this structure allows the heat generated by the semiconductor chip 16 to be dissipated into the second supporting member 24, thereby preventing the temperature rise of the semiconductor chip 16 so that the driving current and driving frequency of the semiconductor chip 16 maybe increased.

In the semiconductor device 10A, since the conductive pattern 14 and the heat radiation electrode 15 are supported by the insulating resin 13, which is a mold, the use of any supporting substrate is unnecessitated. This structure is one feature of the present invention. The conductive paths of the conventional art semiconductor device are supported by a supporting substrate (flexible sheet, printed board or ceramic substrate), or by a lead frame, and this means that the conventional art device includes those elements that could potentially be unnecessitated. On the other hand, the device of the present invention is comprised by only essential, minimal elements, and it eliminates the need for a supporting substrate, thus it can be made thin and light-weighted, and at the same time, its cost may be reduced as it require less material cost.

From the back surface of the package, the bonding pads 14 and the heat radiation electrode 15 are exposed. Where a brazing material such as solder is provided within these regions, since the area of the heat radiation electrode 15 is larger, the thickness of the applied brazing material becomes uneven. Accordingly, in order to make the film thickness of the brazing material even, an insulating film 26 is formed on the back surface of the semiconductor device 10A. The regions surrounded by dotted lines 27 shown in FIG. 2A indicate the portions of the heat radiation electrode 15 exposed from the insulating film 26, and these portions are exposed in the same manner as the exposed square-shaped portions of the back surfaces of the bonding pads 14, the individual potions of the heat radiation electrode 15 exposed from the insulating film 26 and the exposed portions of the bonding pads 14 have the same size.

Thus, the sizes of the portions wettable by the brazing material are substantially identical so that the brazing material formed thereto would have substantially the same thickness. This would not change even after a solder print or reflow process. The same is true for a conductive paste of i.e. Ag, Au or Ag—Pd etc. Given this structure, more accurate calculation can be performed to determine how much the back surface of the metal plate should protrude beyond the back surfaces of the bonding pads 14. Where solder balls are formed as shown in FIG. 2B, the bottom ends of the solder balls may be abutted to conductive paths of the mounting board, so that soldering failure may be eliminated.

The exposed portions 27 of the heat radiation electrode 15 may be formed to have a larger size than that of the exposed portions of the bonding pad in consideration with the dissipation capability of the heat from the semiconductor chip.

The provision of the insulating film 26 also allows the conductive pattern 32 provided on the first supporting member 11 to be disposed over the back surface of the semiconductor device. Generally, the conductive pattern 32 provided on the first supporting member 11 is so arranged that it bypasses the region in which the semiconductor device is attached, however, the provision of the insulating film 26 allows it to be disposed without such bypassing. In addition, since the insulating resin 13 and the insulating adhesive means 17 protrude beyond the conductive patterns, a gap may be formed between the wirings on the first supporting member 11 and the conductive patterns, thereby enabling to prevent short-circuiting.

Embodiment 3

Third Embodiment is provided to illustrate the semiconductor device 10B.

Figure 3A:
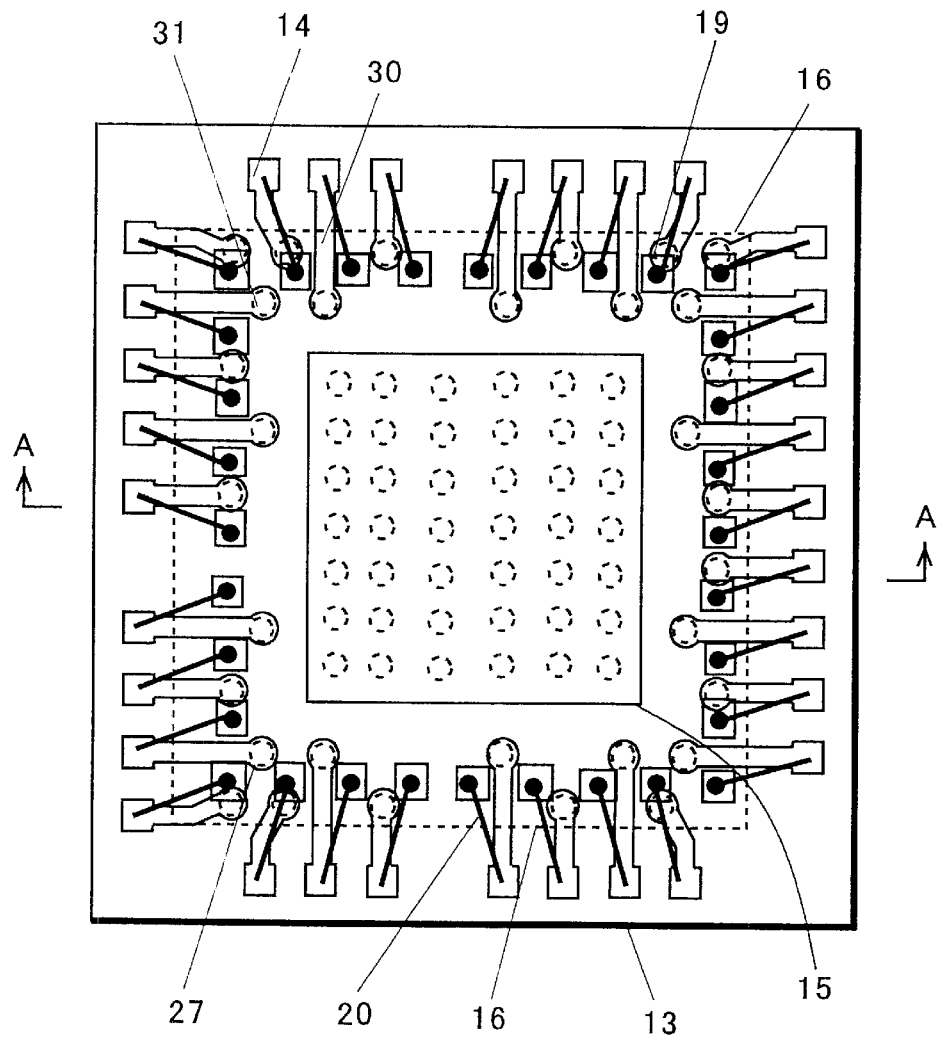
FIGS. 3A and 3B is a diagram illustrating a semiconductor module according to the present invention.
Figure 3B:
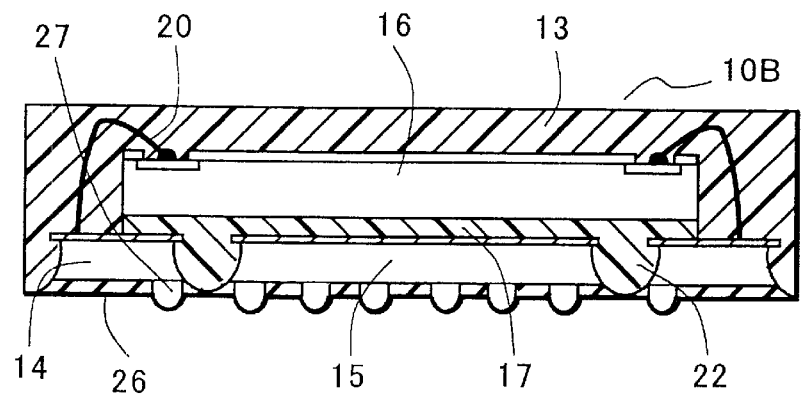

FIG. 3 shows another semiconductor device 10B according to the present invention. FIG. 3A is a plan view thereof, and FIG. 3B is a cross-sectional view taken along the line A—A. Since this structure is similar to that of FIG. 2, the following provides only the description pertinent to those features that are different from the device in FIG. 2.

In FIG. 2, the back surfaces of the bonding pads 14 are used as the external connection electrodes as they are, however, in this embodiment, a wiring 30 and an external connection electrode 31 integrally formed with the wiring 30 are provided to each of the bonding pads 14.

The rectangle shown by a dotted line represents the semiconductor chip 16, and on the back surface of the semiconductor chip 16, the external connection electrodes 31 are disposed in a ring-like arrangement as shown, or in a matrix. This arrangement is identical or similar to that of known BGA. In order to alleviate the distortion at the connection points, they may be formed in a wavy shape.

When the semiconductor chip 16 is disposed directly over the conductive patterns 14, 30 and 31 and the heat radiation electrode 15, the patterns and the heat radiation electrodes are short-circuited via the back surface of the semiconductor chip 16. Accordingly, the adhesive means 17 has to be an insulating material, and any conductive material must not be used. However, if the size of the semiconductor chip is equal to or smaller than the size of the heat radiation electrode, then a conductive adhesive means may be used.

The locations at which the device is connected with the conductive pattern 32 of the first supporting member would be the external connection electrodes 31, and the back surfaces of the bonding pads 14 and the lines 30 are covered by the insulating film 26. The dotted circles indicated in the regions of the external connection electrodes 31 and the heat radiation electrode 15 represent the portions that expose from the insulating film 26.

Furthermore, since the external connection electrodes 31 are provided over the back surface of the semiconductor chip 16, the heat radiation electrode 15 is designed to be smaller than the heat radiation electrode 15 shown in FIG. 2. Accordingly, the insulating adhesive means 17 covers the heat radiation electrode 15, external connection electrodes 31 and a part of the wirings 30. The insulating resin 13 covers the bonding pads 14, a part of the wirings 30, the semiconductor chip 16 and the metal thin lines 20.

The present embodiment has an advantage in that, even when the number of the bonding pads 14 is extremely large and their size has to be reduced, the size of the external connection electrodes 31 may be made sufficiently large by connecting them via the wirings and rearranging them as the external connection electrodes. The presence of the wirings also alleviates the distortion stress applied to the connections of the metal thin lines and the connections of the solder.

Since the semiconductor chip 16 and the heat radiation electrode 15 are affixed with an insulating adhesive means 17, which is an insulating material, there is a concern of thermal resistance. However, by constituting the insulating adhesive means by a silicon resin mixed with fillers such as those made of silicon oxide or aluminum oxide that contribute to thermal conduction, the heat from the semiconductor chip 16 may be efficiently conducted into the heat radiation electrode 15.

The distance between the heat radiation electrode 15 and the back surface of the semiconductor chip 16 may be made even by designing the fillers to have a same diameter. Therefore, where a very small separation is desired in consideration with the thermal conduction, such a small separation may be easily formed by lightly applying a pressure to the semiconductor chip while the insulating adhesive means is in a soft state.

Embodiment 4

The fourth embodiment is provided to explain a manufacturing method of the semiconductor devices 10A and 10B.

Between the manufacturing methods of the semiconductor devices 10A and 10B, the only difference is whether it fabricates a structure including only the heat radiation electrode 15 and the bonding pads 14, or a structure to which the wirings 30 and the external connection electrodes are added, and the rest of the steps are substantially identical.

In the following description, the semiconductor device 10B shown in FIG. 3 is used to illustrate the manufacturing method. FIGS. 4 through 8 show the cross-sectional views taken along the line A—A of FIG. 3A.

Figure 4:
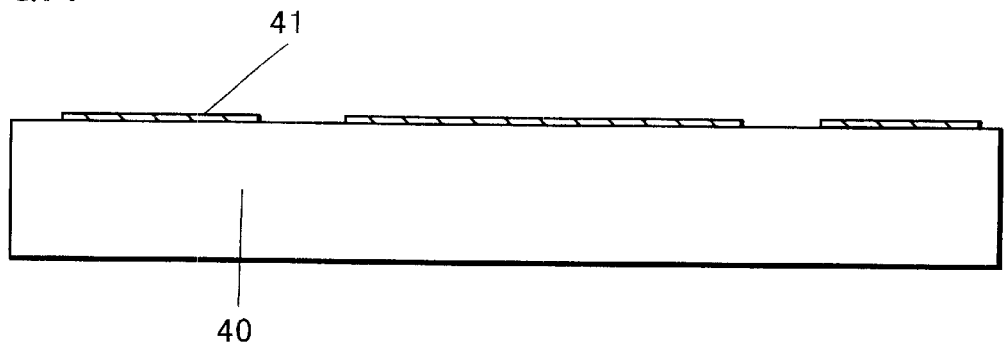
FIG. 4 is a diagram illustrating a manufacturing step of a semiconductor device according to the present invention.

First, as shown in FIG. 4, a conductive foil is provided. The thickness of the foil is desirably between 10 μm and 300 μm, and herein, a rolled copper foil in a thickness of 70 μm is used. Next, over the surface of this conductive foil 40, a conductive film 41 or a photo resist is formed as an etching mask. This pattern is identical to the patterns of the bonding pads 14, wirings 30, external connection electrodes 31 and the heat radiation electrode 15 of FIG. 3A. Where a photo resist is used in place of the conductive film 41, a conductive film of Au, Ag, Pd, Ni or the like should be provided under the photo resist at least over the portions corresponding to the bonding pads. This film is provided to enable the bonding (FIG. 4).

Thereafter, the conductive foil 40 is half-etched via the conductive film 41 or the photo resist. The depth of etching maybe arbitrary so long as that it is shallower than the thickness of the conductive foil 40. A shallower etching depth allows the formation of a finer pattern.

By this half-etching, convex conductive patterns of 14, 30 and 31 and heat radiation electrode 15 manifest on the surface of the conductive foil 40. The conductive foil 40 used herein is a Cu foil mainly made of Cu, which has been formed by rolling as priorly mentioned. However, it may also be a conductive foil made of an Fe—Ni alloy, or a laminate of Cu—Al or Al—Cu—Al. The laminate of Al—Cu—Al, especially, can prevent warping caused by a difference in thermal expansion coefficients.

Figure 5:
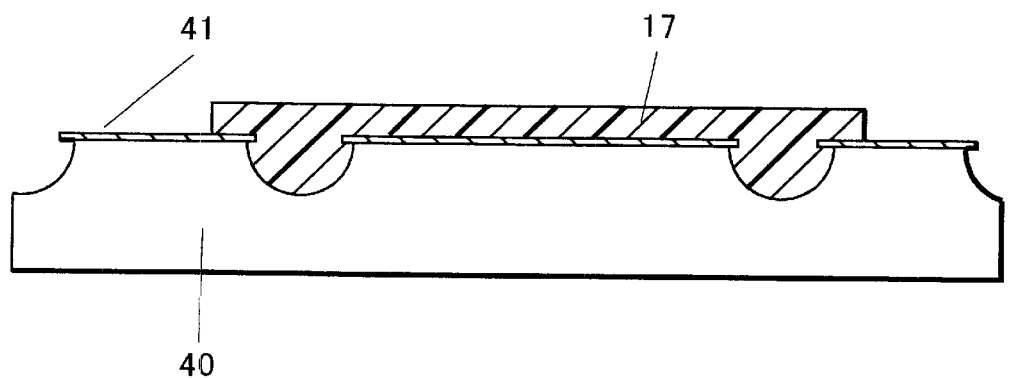
FIG. 5 is a diagram illustrating a manufacturing step of a semiconductor device according to the present invention.

The insulating adhesive means 17 is then provided to the region corresponding to the rectangle delineated by a dotted line in FIG. 3. This insulating adhesive means 17 is provided within and over the isolation trench 22 between the heat radiation electrode 15 and the external connection electrodes 31, an isolation trench between the heat radiation electrode 15 and the wirings 30, and isolation trenches between wirings 30 (FIG. 5).

The semiconductor chip 16 is then affixed to the region in which the insulating adhesive means 17 has been provided, and the bonding electrodes 19 of the semiconductor chip 16 and the bonding pads 14 are electrically connected. In the embodiment shown in the diagrams, since the semiconductor chip 16 is mounted with its face up, the metal thin lines 20 are used as the connecting means.

In this bonding process, since the bonding pads 14 are integral with the conductive foil 40, and the back surface of the conductive foil 40 is flat, it can be abutted to the table of the bonding machine by the plane. Accordingly, if the conductive foil 40 is perfectly fixed to the bonding table, misalignment of the bonding pads 14 would not occur, thus the bonding energy can be efficiently transmitted to the metal thin lines 20 and the bonding pads 14. This allows the connections of the metal thin lines 20 to have improved fixing strength. The fixation to the bonding table may be achieved by, for example, providing a plurality of vacuum holes over the entire surface of the table. Alternatively, the conductive foil 40 may be pressed from the above.

Figure 6:
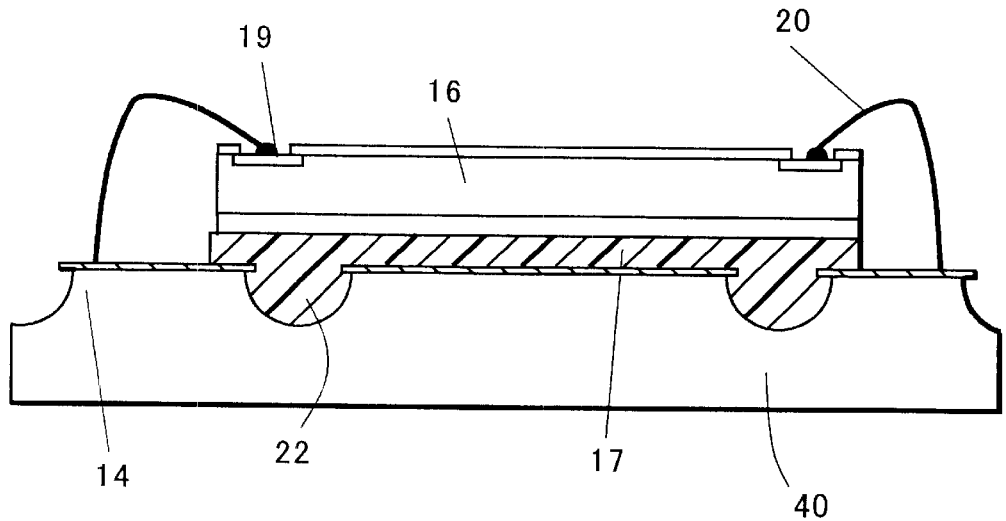
FIG. 6 is a diagram illustrating a manufacturing step of a semiconductor device according to the present invention.

The semiconductor chip may be mounted without using a supporting substrate, so that the semiconductor chip 16 may be disposed at a position lower by the thickness of the supporting substrate. Accordingly, the outer thickness of the package may be reduced as later explained. (FIG. 6)

The insulating resin 13 is then formed so as to cover the bonding pads 14 formed via the half-etching, the wirings 30 exposed from the semiconductor chip 16, the semiconductor chip 16 and the metal thin lines 20. For the insulating resin, either a thermoplastic resin or a heat-curable resin may be used.

It maybe formed via transfer molding, injection molding, dipping or coating. For a heat-curable resin such as epoxy resin, transfer molding may be employed, and for a thermoplastic resin such as liquid crystal polymer or polyphenylene sulfide etc. injection molding may be employed.

In the present embodiment, the thickness of the insulating resin is adjusted so that its top end comes at approximately 10 μm from the top portions of the metal thin lines 20. This thickness maybe made larger or smaller depending on the desired strength of the semiconductor device.

Since the bonding pads 14, wirings 30, the external connection electrodes 31 and the heat radiation electrode 15 are all integral with the conductive foil 40 that is in a form of a sheet, these copper foil patterns would never be displaced during the resin injection step as long as the conductive foil 40 itself is not displaced.

Figure 7:
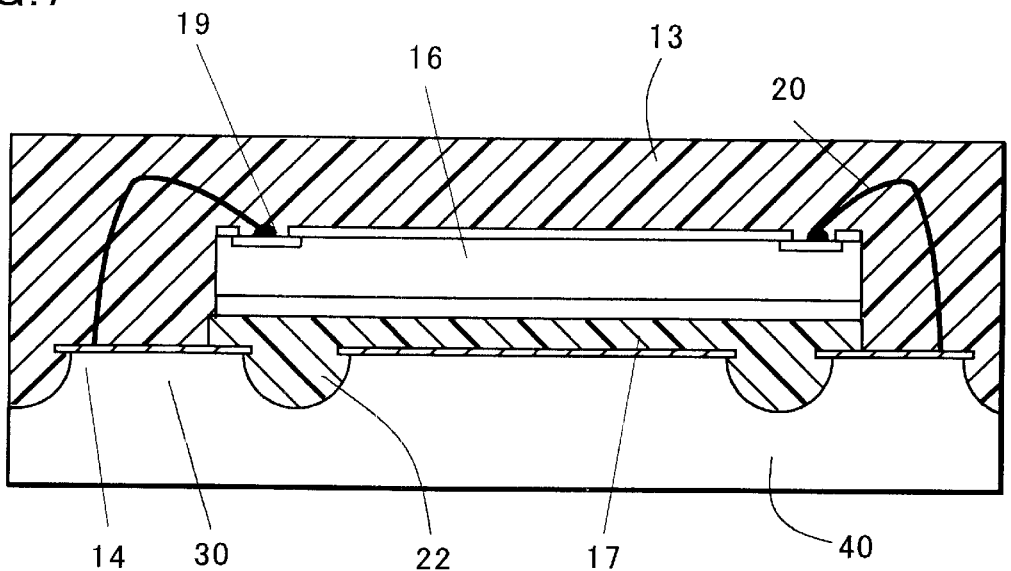
FIG. 7 is a diagram illustrating a manufacturing step of a semiconductor device according to the present invention.
Figure 8:
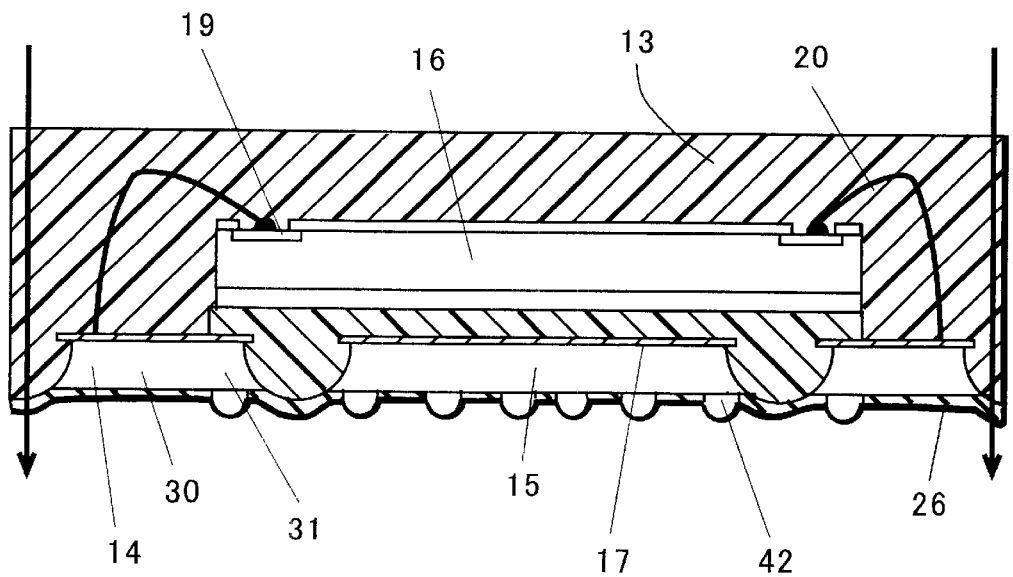
FIG. 8 is a diagram illustrating a manufacturing step of a semiconductor device according to the present invention.

As explained in the above, within the insulating resin 13, the bonding pads 14, wirings 30, external connection electrodes 31, the heat radiation electrode 15 and the semiconductor chip 16 that are convex portions are embedded, and the portion of the conductive foil 40 below its convex portion is exposed on the back surface. (FIG. 7)

Thereafter, the portion of the conductive foil 40 exposed on the back surface of the insulating resin 13 is eliminated, thereby separating the bonding pads 14, wirings 30, external electrodes 31 and heat radiation electrode 15 into individual elements.

For this separation step, various approaches may be contemplated. For example, they may be separated by etching the back surface, or by polishing or grinding, or even by the combination thereof. For example, where the grinding is performed until the insulating resin 13 is exposed, there is a risk of having residues or stretched metal particles from the ground conductive foil 40 encroach into the insulating resin 13 or the insulating adhesive means 17. Accordingly, by using an etching approach, the separation may be achieved without having the metal residues from the conductive foil 40 encroach into the surface of the insulating resin 13 or the insulating adhesive means 17 located between the Cu patterns. In this way, short-circuiting between the patterns arranged at fine intervals may be prevented.

In a case where a plurality of units, each comprising a single semiconductor device 10B, are integrally formed, a dicing step is additionally performed after this separation step.

Although a dicing apparatus is used herein to individually separate the units, it is also possible to perform this step by chocolate-bar-breaking, pressing or cutting.

According to this embodiment, after separating the Cu patterns, an insulating film 26 is formed over the patterns 14, 30, 31 and 15, and the insulating film 26 is then patterned so as to expose the portions indicated by the dotted circles shown in FIG. 3A. Thereafter, it is diced at the sections indicated by arrows into individual semiconductor devices 10B.

The solder balls 42 may be formed either before or after the dicing step.

According to the manufacturing method above, a thin and small package is fabricated, in which the bonding pads, wirings, external connection electrodes, a heat radiation electrode and a semiconductor chip are embedded within the insulating resin.

The insulating adhesive means 17 shown in FIGS. 5 and 6 may be attached at the wafer level before the semiconductor chip 16 is individually separated. That is, at the wafer stage, a sheet-like adhesive may be formed on the back surface of the wafer, and the sheet is then cut along with the wafer during the dicing step, so that the step of forming the insulating adhesive means 17 over the conductive foil 40 shown in FIG. 5 may be unnecessitated.

The effects obtained by the above manufacturing method will now be explained in the following section.

First, since the conductive patterns are half-etched and supported integrally with the conductive foil, a substrate that has been conventionally employed for supporting is unnecessitated.

Second, since the convex conductive patterns are formed by half-etching the conductive foil, it is possible to form finer conductive patterns. Accordingly, their widths and intervals may be minimized, allowing the formation of a package having a smaller two-dimensional size.

Third, since the device may be constituted by conductive patterns, a semiconductor chip, connection means and a sealing material, the structure would include only the elements that are truly essential, eliminating the excessive use of materials, thus, a thin and small semiconductor device may be realized with a substantially reduced cost.

Fourth, since the bonding pads, wirings, external connection electrodes and heat radiation electrode are formed as convex portions through half-etching, and the separation to individual elements is performed after the molding step, tie-bars and suspension leads would not be necessary. Accordingly, the necessity for the formation of tie-bars (suspension leads), and cutting step of the tie-bars (suspension leads) are completely eliminated in the present invention.

Fifth, since the conductive foil is eliminated from the back surface of the insulating resin to separate the conductive patterns after the convex conductive patterns are embedded within the insulating resin, flashes of the resin formed between leads as those present in the conventional lead frames can be eliminated.

Sixth, since the semiconductor chip is affixed with the heat radiation electrode via the insulating adhesive means, and the heat-dissipating electrode is exposed from the back surface, the heat generated by the semiconductor device can be dissipated efficiently from the back surface of the semiconductor device. Furthermore, by mixing fillers such as those made of silicon oxide or aluminum oxide into the insulating adhesive means, the heat-dissipating property thereof may further be improved. By uniformly designing the filler size, the spacing between the semiconductor chip 16 and the conductive patterns may be evenly retained.

Embodiment 5

The fifth embodiment is provided to illustrate a semiconductor device 10A, 10B to which a metal plate 23 is affixed and a semiconductor module using the same.

FIG. 1 shows this type of semiconductor module (FCA) 50. The semiconductor device mounted thereto is the semiconductor device 10A shown in FIG. 2.

First, a first supporting member 11 constituted by a flexible sheet will be explained. In the present embodiment, it comprises a first PI sheet 51, a first adhesion layer 52, a conductive pattern 53, a second adhesion layer 54 and a second PI sheet that are sequentially laminated from the bottom. When forming the conductive pattern in multiple layers, additional adhesion layers may be used, and upper and lower layers of the conductive pattern may be electrically connected through contact holes. Provided in this first supporting member 11 is a first opening 12 which would allow at least a metal plate 23 to be exposed as shown in FIG. 1C.

A second opening 56 is also formed in order to expose the conductive pattern. The second opening 56 may entirely expose the corresponding conductive pattern 32, or may partially expose only the portion for forming connections. For example, the second PI sheet 55 and the second adhesion layer 54 may entirely be eliminated, or, as shown in the figure, while entirely eliminating the second PI sheet, the second adhesion layer 54 may partially be eliminated only at the locations required to be exposed. According to the later manner, running of the solder 27 may be prevented.

In the semiconductor device of the present invention, a metal plate 23 is adhered to the back surface of the heat radiation electrode 15. In the semiconductor module of the present invention, the metal plate 23 and the back surface of the first supporting member would become substantially within a same plane.

The thickness of the metal plate 23 is determined according to the thicknesses of the first supporting member 11 and the fixation plate 25. The thicknesses are respectively determined in a manner so that the back surface of the metal plate 23 exposed from the first opening 12 and the back surface of the first supporting member 11 can be substantially within a same plane when the bonding pads 14 and the conductive pattern 32 are affixed together through the solder balls 27. Accordingly, the metal plate 23 may be abutted to the second supporting member or abutted and adhered to the fixation plate 25 provided on the second supporting member.

Several examples of this connection structure are given below.

In the first example of the structure, a light-weight metal plate such as the one made of Al or stainless steel etc., or a ceramic substrate is used as the second supporting member 24, and the metal plate 23 which has been affixed on the back surface of the semiconductor device 10A is abutted thereto. That is, in this structure, the abutment to the second supporting member 24 is provided without the use of the fixation plate 25. The fixation between the heat radiation electrode 15 and the metal plate 23, and between the metal plate 23 and the second supporting member 24 is achieved by a brazing material such as solder etc. or an insulating adhesive means containing fillers having a superior thermal conductivity.

In the second example, the structure employs a light-weight metal plate such as the one made of Al or stainless steel etc. or a ceramic substrate as for the second supporting member 24, and a fixation plate 25 is formed thereon, and this fixation plate 25 and the metal plate 23 is affixed together.

Where an Al plate is used as the second supporting member 24 for example, the fixation plate 25 is preferably the one made of Cu. This is because Cu can be plated over Al to form a Cu film in a thickness up to about 10 µm. In addition, since it is a plated film, it may be formed in intimate contact with the second supporting member 24, making the thermal resistance between the fixation plate 25 and the second supporting member 24 extremely small.

Alternatively, the Cu fixation plate 25 and the Al substrate may be adhered using an adhesive, however, in this case the thermal resistance would become larger.

Where a ceramic substrate is used as the second supporting member 24, the fixation plate 25 is attached on an electrode formed by print-baking a conductive paste.

The second supporting member 24 and the first supporting member 11 are adhered together via a third adhesion layer 57.

For instance, where;
First PI sheet 51: 25 $\mu$m
Second PI sheet 55: 25 $\mu$m
First and second adhesion layers 52 and 54: 25 $\mu$m after being baked (an acrylic adhesive is used)
Conductive pattern 53: 25 $\mu$m
Solders 27: 50 $\mu$m;
then the total film thickness of the first supporting member 11 would be 125 $\mu$m. Taking this thickness into account, the back surface of the first supporting member 11 and the back surface of the metal plate 23 are made substantially within a same plane.

As for the third adhesion layer 57 (25 $\mu$m) an acrylic adhesive is used. In this way, by adjusting the thicknesses of the respective layers, the second supporting member 24 having the fixation plate 25 formed thereon may be attached to the first supporting member 11 after the semiconductor device 10A is attached to the first supporting member 11.

Where a module is provided, in which the second supporting member 24 is attached to the first supporting member 11, and the semiconductor device 10 is placed within an opening 56 provided in this module and then soldered, the soldering may be performed at once without promoting connection failures.

Accordingly, the heat generated by the semiconductor chip 16 may be dissipated into the second supporting member 24 via the heat-dissipating plate 15, metal plate 23 and fixation plate. Moreover, since it provides a substantial reduction in the thermal resistance compared to that of the conventional art structure (FIG. 15B), the driving current and the driving frequency of the semiconductor chip 16 can be maximized. The back surface of this second supporting member 24 maybe attached to the actuator 107, bottom of the casing 101 or the arm 105 shown in FIG. 14. Therefore, the heat from the semiconductor chip can ultimately be emitted to the outside via the casing 101. Accordingly, even if the semiconductor module is mounted in the hard disk 100, the temperature of the semiconductor chip itself is kept relatively low, so that the read/write speed of the hard disk 100 can be further accelerated. This FCA may be mounted on an apparatus other than a hard disk. In this case, the second supporting member should be abutted to a member of the apparatus having a small thermal resistance.

Embodiment 6

The sixth embodiment is provided to illustrate a semiconductor device 10C in which the metal plate 23 and the heat radiation electrode 15 are integrally formed, and a semiconductor module 50A using the same.

Figure 9:
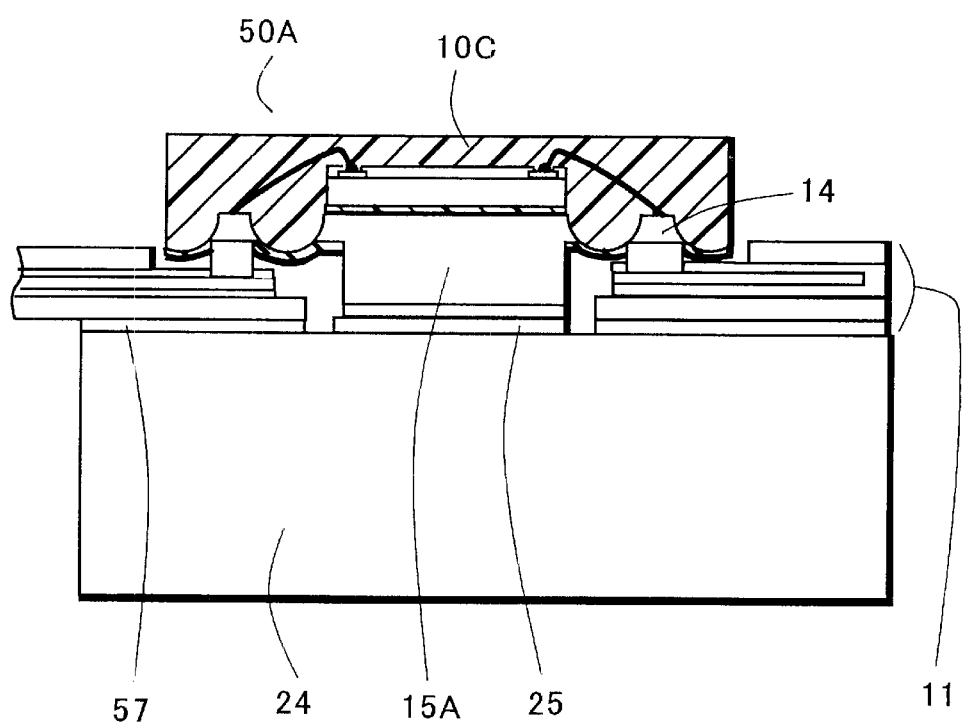
FIG. 9 is a diagram illustrating a semiconductor module of the present invention.

FIG. 9 shows a structure in which the heat radiation electrode 15A protrudes beyond the back surfaces of the bonding pads 14 as if the heat radiation electrode 15 and the metal plate 23 are constituted by an integral element.

First, the manufacturing method thereof will be explained with reference to FIGS. 10 and 11. Its manufacturing steps corresponding to the steps illustrated in FIGS. 4 through 7 are identical and the descriptions for these steps would not be repeated.

Figure 10:
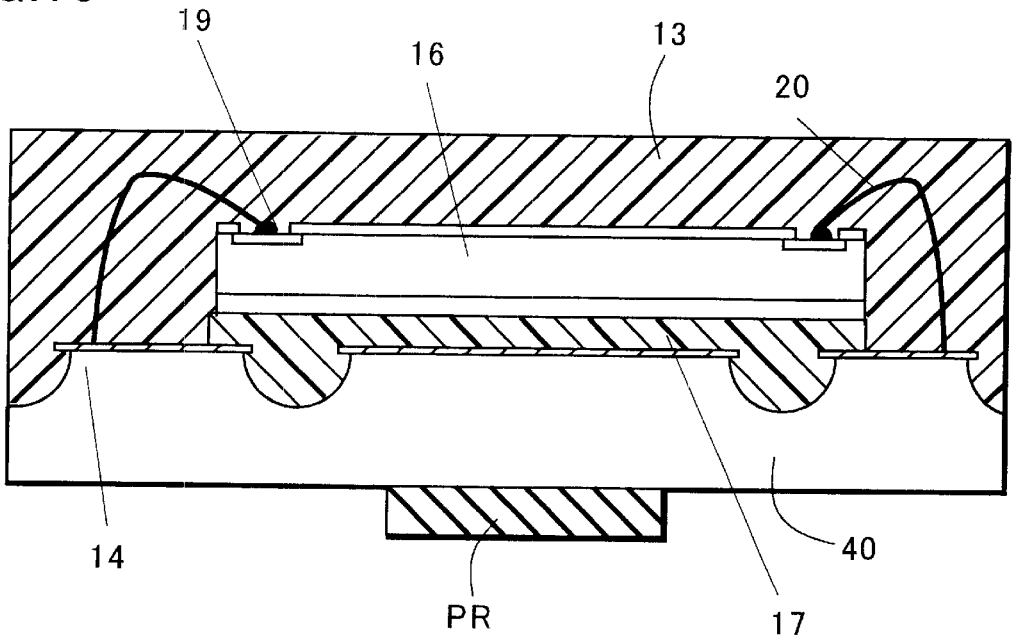
FIG. 10 is a diagram illustrating a manufacturing step of a semiconductor device according to the present invention.
Figure 11:
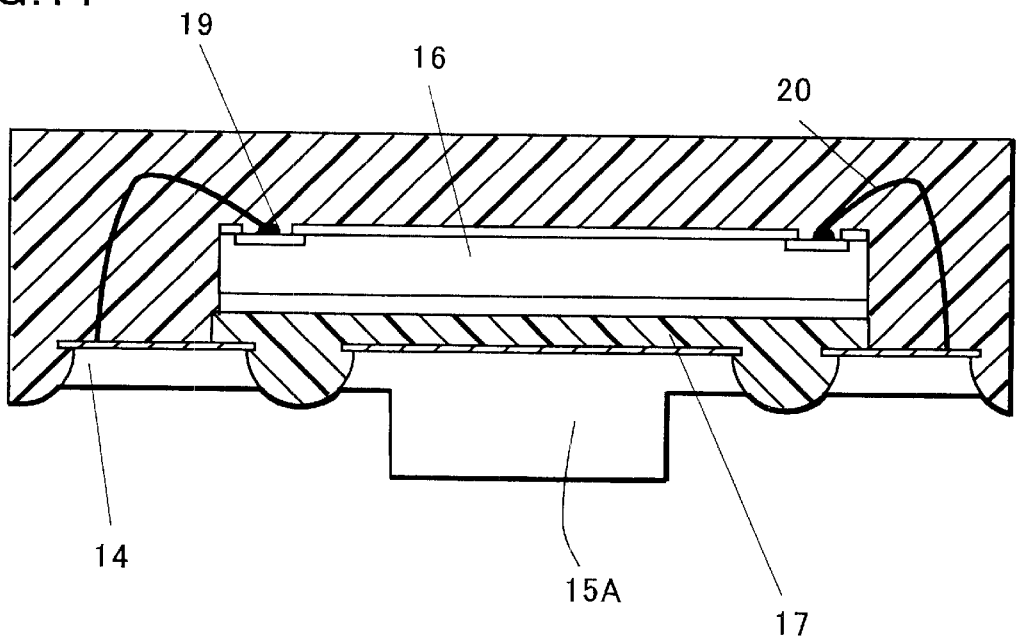
FIG. 11 is a diagram illustrating a manufacturing step of a semiconductor device according to the present invention.

FIG. 10 is showing the conductive foil 40 being covered by the insulating resin 13, and on the portion corresponding to the heat radiation electrode 15, a photo resist PR is formed. When this conductive foil 40 is etched via the photo resist PR, the resultant heat radiation electrode 15A would have a structure which protrudes beyond the back surfaces of the bonding pads 14. Alternatively, a conductive film made of Ag or Au etc. may be selectively formed an used as a mask instead of the photo resist PR. This film would function also as an anti-oxidizing film.

In the structure such as the one shown in FIG. 1 in which the metal plate 23 is adhered, since the metal plate 23 is extremely thin (i.e. 125 $\mu$m), the workability is extremely poor. On the other hand, where the heat radiation electrode 15A is etched to have the protrusive structure, the attaching step of the metal plate 23 may be eliminated.

Figure 12:
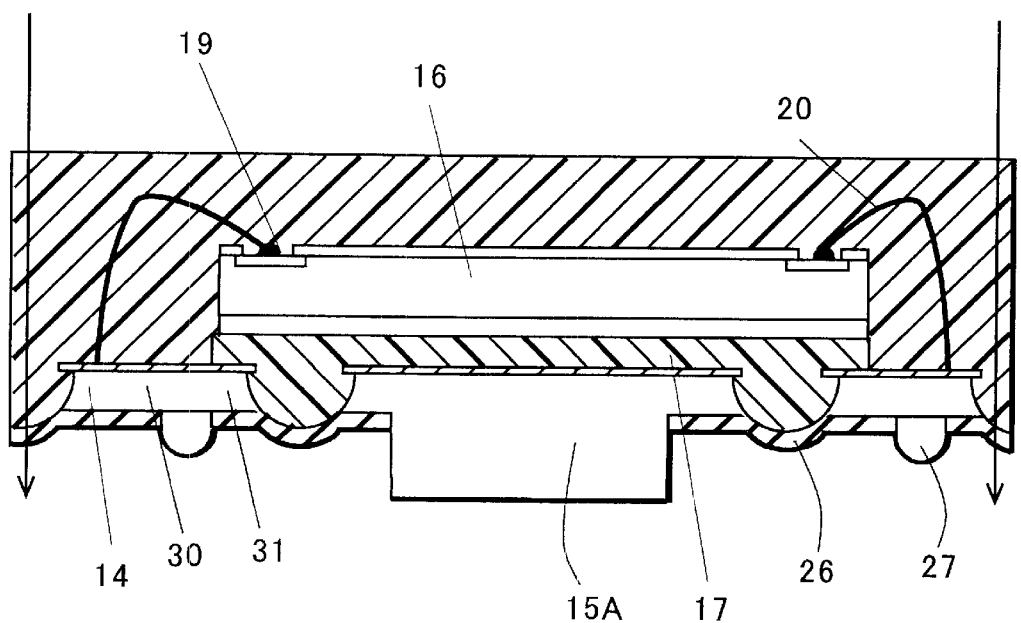
FIG. 12 is a diagram illustrating a manufacturing step of a semiconductor device according to the present invention.

Next, as shown in FIG. 12, after the bonding pads 14, wirings 30 and external connection electrodes 31 are completely separated, the insulating film 26 is formed, and the portions for forming solder balls 27 are exposed. After the solder balls 27 are provided, it is diced at the sections indicated by arrows.

The isolated semiconductor device is then mounted on the first supporting member 11 as shown in FIG. 9. Thereafter, these second supporting member 24 is attached thereto as previously mentioned. At this point, since the heat radiation electrode 15A is protrusive, it can be readily connected to the fixation plate 25 via soldering etc.

Embodiment 7

The seventh embodiment for illustrate semiconductor device

FIG. 13A shows a plan view of the semiconductor device according to the present invention, and FIG. 13B shows a cross-sectional view of FIG. 13A taken along the line A—A.

According to the present invention, a first die pad 70A and a second die pad 70B are disposed substantially in a same plane, and along the peripheries of these die pads, bonding pads 14 are arranged. The back surfaces of these bonding pads 14 themselves serve as the external connection electrodes, however, the re-arranged type of wirings shown in FIG. 3 may instead be employed. Between the first and second die pads 70A and 70B, at least one bridge 71 is disposed.

Over the first die pad 70A, a first semiconductor chip 16A is affixed, and over the second die pad 70b, a second semiconductor chip 16B is affixed, and they are connected via metal thin lines 20.

The metal thin lines include a first set of metal thin lines 20A that are connected to the bonding pads 14 and a second set of metal thin lines 20B that are connected to the bridges 71. A plurality of bonding electrodes 19 are provided on the semiconductor chips. According to I/O signals to and from the bonding electrodes 19, at least a part of the bonding electrodes 19 are selected, and the locations and count of the bonding pads 14 are determined correspondingly. The selected bonding electrodes 19 on the semiconductor chips and the bonding pads 14 are connected via the first set of metal thin lines 20A.

On the other hand, the connection between the first and second semiconductor chips 16A and 16B is provided by the second set of metal thin lines 20B connecting between the bonding pads on the first semiconductor chip 16A and one ends of the bridges 71, and between the other ends of the bridges 71 and the bonding pads on the second semiconductor chip 16B.

Since the bridges 71 are provided in the present structure, the ends of the metal thin lines connected on the side of the first and second semiconductor chips 16A and 16B may all be connected by ball bonding.

As apparent from the manufacturing method previously explained, by half-etching the conductive foil, and performing the molding of the insulating resin 13 before it is completely isolated, the risk of having the bridges 71 fall down or slip out may be eliminated.

According to the present invention, a plurality of chips may be packaged into a single package as this embodiment.

The embodiments described heretofore are provided in order to illustrate the structures designed in consideration with the heat-dissipating property of a single read/write amplifying IC. However, where the applications to various types of apparatus are contemplated, there may be a case in which the heat-dissipating property of a plurality of semiconductor chips must be considered. Of course, it is possible to package them into separate, individual packages, however, the plurality of the semiconductor chips may also be packaged into one package as illustrated in FIG. 13.

The metal plates may of course be provided in either the structure in which they are connected to the die pads 70 or the structure in which the die pads 70 themselves are designed to have the protrusive structure. These may be mounted on a flexible sheet or a flexible sheet having the second supporting member attached thereon.

The embodiments described above are explained with a flexible sheet as a substrate, however, a ceramic substrate, a printed board, a flexible sheet, a metal substrate or a glass substrate etc. can also be applied to the substrate of the present invention.

As apparent from the above description, according to the present invention, a metal plate is affixed to a heat radiation electrode exposed from the back surface of a package to provide a semiconductor device in which the metal plate protrudes beyond external connection electrodes or the back surfaces of the bonding pads, thereby facilitating the mounting of the device on an FCA.

Especially, by providing an opening to the FCA so as to allow the back surface of the FCA and the heat radiation electrode of the semiconductor device are within a same plane, the abutment to the second supporting member can be readily achieved.

By using Al as for the second supporting member material and by forming thereon a fixation plate made of Cu, and affixing the heat radiation electrode or the metal plate to this fixation plate, the heat generated by the semiconductor chip may be externally dissipated via the second supporting member.

Accordingly, the temperature rise of the semiconductor chip may be prevented, allowing the device to operate at a higher performance level close to its inherent capability. Especially, such an FCA used in a hard disk is capable of providing efficient external emission of heat so that the read/write speed of the hard disk may be increased.

Figure 15A:
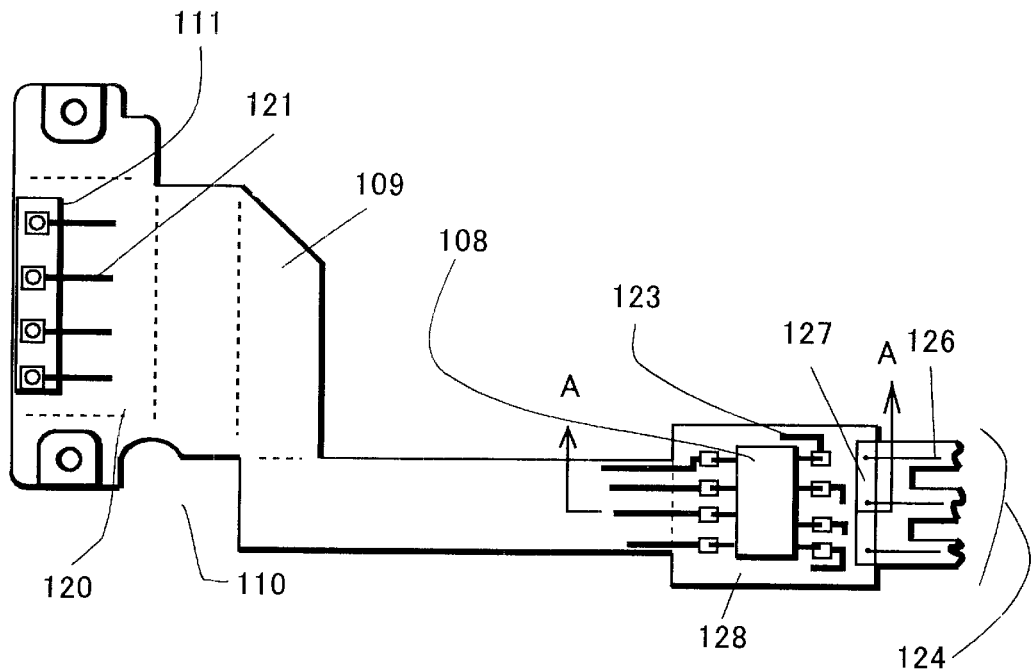
FIGS. 15A and 15B is a diagram illustrating a semiconductor module according to the present invention. semiconductor module employed in the hard disk of FIG. 14.
Figure 15B:
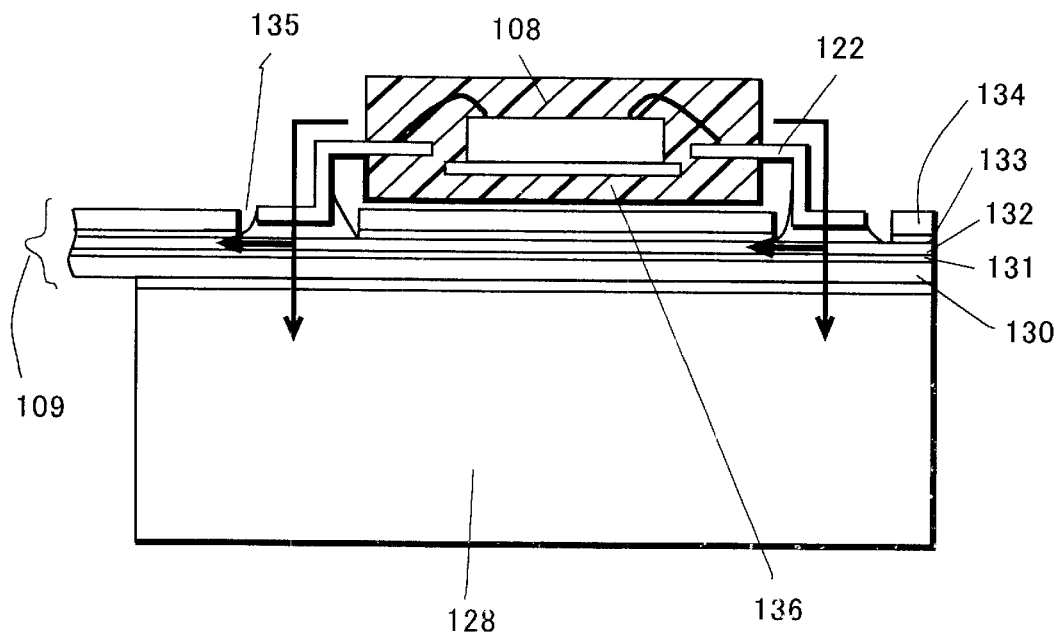

The following is a description of a comparative experiments regarding the temperature rise of the IC chips between the present invention (shown in FIG. 9) and the conventional art (shown in FIG. 15B)

CONDITIONS

Semiconductor devices are set at 55 [° C.] in a temperature controlled room at first, then a cycle (writing time: 40 [ms]; non-writing time: 10 [ms]) is repeated for 1 hour. The temperature of the IC chip is measured by a temperature of the IC is measured by a temperature sensor provided in the IC chip.

RESULTS

The temperature of the IC chip in the conventional lead frame type shown in FIG. 15B is 82 [° C.]. On the other hand, the temperature of the IC chip shown in FIG. 9 is 63 [° C.]. The temperature rise of the IC chips are:

conventional type (FIG. 15B): 82-55=27 [° C.]

the present invention (FIG. 9): 63-55=8 [° C]

The result indicates that the IC chip of the present invention improves that the temperature rise characteristic of about 70 [%] as compared with that of conventional construction in accordance with the following expression: 100-8/27×100=70.4 [%]

What is claimed is:

1. A semiconductor device comprising:

a semiconductor chip integrally molded within an insulating resin, said chip and said insulating resin each having corresponding front and back exterior surfaces;

a pad electrically connected to a bonding electrode of the semiconductor chip, said pad being exposed from the back surface of the insulating resin;

a heat radiation electrode thermally coupled to the back surface of the semiconductor chip, said heat radiation electrode being exposed from the back surface of the insulating resin; and a metal plate provided on the exposed portion of the heat radiation electrode to protrude from the back surface of the insulating resin beyond said pad.

2. A semiconductor device as claimed in claim 1, wherein the exposed surface of the pad and the exposed surface of the heat radiation electrode are disposed substantially within a same plane.

3. A semiconductor device as claimed in claim 1, wherein the semiconductor chip and the heat radiation electrode are affixed together using an insulating material or a conductive material.

4. A semiconductor device as claimed in claim 3, wherein the heat radiation electrode and the metal plate are affixed together using an insulating material or a conductive material.

5. A semiconductor device as claimed in claim 3, wherein the heat radiation electrode and the metal plate are integrally formed from the same material.

6. A semiconductor device as claimed in claim 1, wherein the back surface of the insulating resin protrudes beyond the exposed surface of the pad.

7. A semiconductor device as claimed in claim 6, wherein the side surfaces of the pad and the back surface of the insulating resin which extends from the side surfaces of the pad define a same curved surface.

8. A semiconductor module comprising:

a first supporting member having a conductive pattern provided thereon;

a semiconductor device comprising:

a semiconductor chip which is electrically connected to the conductive pattern and is integrally molded by an insulating resin, said chip and said insulating resin each having corresponding front and back exterior surfaces;

a pad electrically connected to a bonding electrode of the semiconductor chip and the conductive pattern, said pad being exposed on the back surface of the insulating resin;

a heat radiation electrode thermally coupled with the back surface of the semiconductor chip, said heat radiation electrode being exposed from the back surface of the insulating resin;

an opening portion provided in the first supporting member at a location corresponding to the heat radiation electrode; and a metal plate provided on the exposed portion of the heat radiation electrode in the opening portion.

9. A semiconductor module as claimed in claim 8, wherein a second supporting member having the metal plate affixed thereto is adhered onto the exposed surface of the first supporting member.

10. A semiconductor module as claimed in claim 8, wherein the heat radiation electrode and the metal plate are formed integrally from the same material.

11. A semiconductor module as claimed in claim 9, wherein a fixation plate made of a conductive material is provided on the second supporting member at a location corresponding to the metal plate, and the fixation plate and the metal plate are thermally coupled.

12. A semiconductor module as claimed in claim 11, wherein the metal plate is mainly made of Cu, the second supporting member is mainly made of Al, and the fixation plate is constituted by a plated film mainly made of Cu which is formed on the second supporting member.

13. A semiconductor module as claimed in claim 8, wherein the back surface of the insulating resin protrudes beyond the back surface of the pad.

14. A semiconductor module as claimed in claim 13, wherein the side surfaces of the pad and the back surface of the insulating resin which extends from the side surfaces of the pad define a same curved surface.

15. A semiconductor module as claimed in claim 8, wherein the semiconductor chip is a read/write amplifying integrated circuit for a hard disk.

16. A semiconductor device comprising:
a semiconductor chip integrally molded by an insulating resin, said chip and said insulating resin each having corresponding front and back exterior surfaces;
a pad electrically connected to a bonding electrode of the semiconductor chip;
an external connection electrode extending via wiring integral with the pad, said external connection electrode being exposed from the back surface of the insulating resin;
a heat radiation electrode thermally coupled with the back surface of the semiconductor chip, said heat radiation electrode being exposed from the back surface of the insulating resin; and
a metal plate provided on the exposed portion of the heat radiation electrode to protrude beyond the back surface of the external connection electrode.

17. A semiconductor device as claimed in claim 16, wherein the back surface of the external connection electrode and the back surface of the heat radiation electrode are disposed substantially within the same plane.

18. A semiconductor device as claimed in claim 16, wherein the semiconductor chip and the heat radiation electrode are affixed together using an insulating material or a conductive material.

19. A semiconductor device as claimed in claim 18, wherein the heat radiation electrode and the metal plate are affixed together using an insulating material or a conductive material.

20. A semiconductor device as claimed in claim 18, wherein the heat radiation electrode and the metal plate are formed integrally from a same material.

21. A semiconductor device as claimed in claim 16, wherein the back surface of the insulating resin protrudes beyond the back surface of the external connection electrode.

22. A semiconductor device as claimed in claim 21, wherein the side surfaces of the external connection electrode and the back surface of the insulating material extending from the side surfaces of the external connection electrode define a same curved surface.

23. A semiconductor module comprising:
a first supporting member having a conductive pattern provided thereon;
a semiconductor device comprising:
a semiconductor chip which is electrically connected to the conductive pattern and is integrally molded within an insulating resin, said chip and said insulating resin each having corresponding front and back exterior surfaces;
a pad electrically connected to a bonding electrode of the semiconductor chip;
an external connection electrode provided via a wiring integral with the pad, said external connection electrode being exposed from the back surface of the insulating resin and electrically connected to the conductive pattern;
a heat radiation electrode thermally coupled with the back surface of the semiconductor chip, said heat radiation electrode being exposed from the back surface of the insulating resin;
an opening in the first supporting member at a location corresponding to the heat radiation electrode; and
a metal plate provided on the exposed portion of the heat radiation electrode and located in said opening.

24. A semiconductor module as claimed in claim 23, wherein a second supporting member having the metal plated affixed thereto is adhered onto the back surface of the first supporting member.

25. A semiconductor module as claimed in claim 23, wherein the heat radiation electrode and the metal plate are formed integrally from a same material.

26. A semiconductor module as claimed in claim 24, wherein a fixation plate made of a conductive material is provided on the second supporting member at a location corresponding to the metal plate, and the fixation plate and the metal plate are thermally coupled.

27. A semiconductor module as claimed in claim 26, wherein the metal plate is mainly made of Cu, the second supporting member is mainly made of Al, and the fixation plate is constituted by a plated film mainly made of Cu formed on the second supporting member.

28. A semiconductor module as claimed in claim 23, wherein the back surface of an insulating adhesive means protrudes beyond the back surface of the external connection electrode.

29. A semiconductor module as claimed in claim 28, wherein the side surfaces of the external connection electrode and the back surface of the insulating adhesive means adhered to the external connection electrode define a same curved surface.

30. A semiconductor module as claimed in claim 23, wherein the semiconductor chip is a read/write amplifying integrated circuit for a hard disk.

31. A hard disk comprising a semiconductor device, wherein the semiconductor device comprising:
a semiconductor chip integrally molded by an insulating resin, said chip and said insulating resin each having corresponding front and back exterior surfaces;

a pad electrically connected to a bonding electrode of the semiconductor chip, said pad being exposed from the back surface of the insulating resin;

a heat radiation electrode thermally coupled to the back surface of the semiconductor chip, said heat radiation electrode being exposed from the back surface of the insulating resin; and a metal plate provided on the exposed portion of the heat radiation electrode to protrude from the back surface of the insulating resin beyond said pad.

32. A hard disk comprising a semiconductor module, wherein the semiconductor module comprises:

a first supporting member having a conductive pattern provided thereon;

a semiconductor device comprising:

a semiconductor chip which is electrically connected to the conductive pattern and is integrally molded by an insulating resin, said chip and said insulating resin each having corresponding front and back exterior surfaces;

a pad electrically connected to a bonding electrode of the semiconductor chip and the conductive pattern, said pad being exposed on the back surface of the insulating resin;

an opening portion provided in the first supporting member at a location corresponding to the heat radiation electrode; and a metal plate provided on the exposed portion of the heat radiation electrode in the opening portion.

33. A hard disk comprising a semiconductor device, wherein the semiconductor device comprises:

a semiconductor chip integrally molded within an insulating resin, said chip and said insulating resin each having corresponding front and back exterior surfaces;

a pad electrically connected to a bonding electrode of the semiconductor chip;

an external connection electrode extending via wiring integral with the pad, said external connection electrode being exposed from the back surface of the insulating resin;

a heat radiation electrode thermally coupled with the back surface of the semiconductor chip, said heat radiation electrode being exposed from the back surface of the insulating resin; and a metal plate provided on the exposed portion of the heat radiation electrode to protrude beyond the back surface of the external connection electrode.

34. A hard disk comprising a semiconductor module, wherein the semiconductor module comprises:

a semiconductor device comprising:

a semiconductor chip which is electrically connected to the conductive pattern and is integrally molded within an insulating resin, said chip and said insulating resin each having corresponding front and back exterior surfaces;

a pad electrically connected to a bonding electrode of the semiconductor chip;

an external connection electrode provided via a wiring integral with the pad, said external connection electrode being exposed from the back surface of the insulating resin and electrically connected to the conductive pattern;

a heat radiation electrode thermally coupled with the back surface of the semiconductor chip, said heat radiation electrode being exposed from the back surface of the insulating resin;

an opening in the first supporting member at a location corresponding to the heat radiation electrode; and a metal plate provided on the exposed portion of the heat radiation electrode and located in said opening.

35. A semiconductor module as claimed in claim 1, wherein the pad and the heat radiation electrode are made of the same material.

36. A semiconductor module as claimed in claim 1, wherein the pad and the heat radiation electrode are separated by an isolation trench.

* * * * *